US 6,745,137 B2

(12) United States Patent
Krishnamachari et al.

(10) Patent No.: US 6,745,137 B2
(45) Date of Patent: Jun. 1, 2004

(54) SINGLE ENDED ATTENUATION MEASUREMENT

(75) Inventors: Srivathsan Krishnamachari, Cambridge, MA (US); Ali Haghighi-Mood, Andover, MA (US); Neil Judell, Andover, MA (US)

(73) Assignee: Vigilant Networks LLC, Hampton, NH (US)

(*) Notice: Subject to any disclaimer, the term of this patent is extended or adjusted under 35 U.S.C. 154(b) by 200 days.

(21) Appl. No.: 09/904,822

(22) Filed: Jul. 13, 2001

(65) Prior Publication Data

US 2002/0105912 A1 Aug. 8, 2002

Related U.S. Application Data

(60) Provisional application No. 60/218,413, filed on Jul. 14, 2000.

(51) Int. Cl.[7] .............................................. G06F 19/00
(52) U.S. Cl. ........................................ 702/57; 324/616
(58) Field of Search ............................. 702/57, 58, 59, 702/60, 64, 65, 66, 69, 76, 77, 79, 81, 83, 90, 106, 111; 324/533, 616, 628, 638; 375/232, 293

(56) References Cited

U.S. PATENT DOCUMENTS

| | | | | |
|---|---|---|---|---|
| 4,970,466 A | | 11/1990 | Bolles et al. .................. 324/533 |
| 5,128,619 A | * | 7/1992 | Bjork et al. ................... 324/533 |
| 5,307,284 A | * | 4/1994 | Brunfeldt et al. .............. 702/76 |
| 5,502,392 A | * | 3/1996 | Arjavalingam et al. ....... 324/638 |
| 5,530,367 A | * | 6/1996 | Bottman ....................... 324/616 |
| 5,539,321 A | * | 7/1996 | Sciacero et al. .............. 324/628 |
| 5,548,222 A | | 8/1996 | Jensen et al. ................. 324/628 |
| 5,638,435 A | * | 6/1997 | Axling et al. ................. 379/286 |
| 5,821,760 A | * | 10/1998 | Koeman et al. .............. 324/628 |
| 6,016,464 A | | 1/2000 | Richardson ................... 702/79 |
| 6,104,197 A | * | 8/2000 | Kochan ......................... 324/533 |
| 6,104,200 A | * | 8/2000 | Hook ............................. 324/643 |
| 6,433,558 B1 | * | 8/2002 | Sciacero et al. .............. 324/628 |
| 6,438,162 B1 | * | 8/2002 | Boyd et al. ................... 375/232 |
| 6,542,555 B2 | * | 4/2003 | Dally ............................ 375/296 |

FOREIGN PATENT DOCUMENTS

| | | |
|---|---|---|
| EP | 0 391 312 A2 | 10/1990 |
| EP | 0 721 100 A2 | 7/1996 |
| EP | 0 882 993 A2 | 12/1998 |
| WO | WO 97/27685 | 7/1997 |
| WO | WO 98/01976 | 1/1998 |
| WO | WO 98/19422 | 5/1998 |

* cited by examiner

Primary Examiner—Marc S. Hoff
Assistant Examiner—Mohamed Charioui
(74) Attorney, Agent, or Firm—Rader, Fishman & Grauer PLLC

(57) ABSTRACT

A signal-based cable attenuation measurement device, system and methodology provides measurement of attenuation characteristics of a cable over a wide frequency spectrum. Located at a single location on a cable, a measurement device injects a signal on to the cable under measurement and receives the reflected signal, recording physical characteristics of the cable in response to the signal. A model, calibrated to estimate the effects of the cable with known impedances, evaluates the waveform generated from the cable's response to the signal and computes attenuation of the cable as a function of frequency. In some circumstances, when low signal-to-noise effects result, normally at high frequencies in long cables, the attenuation of the cable is further fitted to the model to correct the errors that occur as a result of the low signal-to-noise effects.

30 Claims, 11 Drawing Sheets

US 6,745,137 B2

SINGLE ENDED ATTENUATION MEASUREMENT

RELATED APPLICATION

This application claims priority to U.S. Provisional Application No. 60/218,413, filed on Jul. 14, 2000, the contents of which are incorporated herein in it entirety.

FIELD OF THE INVENTION

The present invention relates to a network analysis device, system and methodology, and more particularly, to a network measurement device and a method that evaluates physical characteristics of network cables in response to a single to determine attenuation of open or shorted network cables from a single end of the network cables.

BACKGROUND OF THE INVENTION

This invention relates generally to cable testing and troubleshooting and in particular to measuring the attenuation characteristics of cables.

Local Area Networks (LANs) include a large number of interconnected computers, work stations, printers, and file servers and other devices. A LAN is commonly implemented by physically connecting these devices with copper-conductor, twisted-pair LAN cables, the most common being an eight-wire cable which is configured in four twisted-wire pairs (commonly referred to simply as "twisted pairs") within a flexible wrapper that may include an electrostatic shield, with each end of the cable terminated in an industry-standard connector or terminator. A LAN that has been poorly installed, or has faulty cables or connectors, can result in data transmission errors. Therefore, the LAN must be tested to verify proper operation and performance.

Attenuation limit is a specified performance parameter that indicates the maximum signal loss allowable in a network system. Attenuation is the decrease in the power of a signal as it propagates along a cable. Alternatively, it may result from signal loss through a faulty connector or damage to the cabling. If the attenuation exceeds a specified limit, the network is not in compliance with performance specifications.

Traditionally, cable attenuation is calculated through measurement of the ratio between input and output amplitudes at different frequencies. A conventional methodology for measuring attenuation requires access to both ends of the cable under measurement. A standard configuration to implement this methodology typically involves a main testing/troubleshooting unit and a remote unit coupled via industry-standard connectors to opposite ends of the cable. The remote unit measures the signal at the other end of the cable in response to each stimulus signal received from the main unit positioned at the opposite end of the cable. The signal source is incremented in discrete steps across a range of frequencies, while making measurements of the input and output amplitudes at different frequencies. A ratio between the input and output amplitudes at different frequencies is compared with a worst-case attenuation versus frequency function specified for the cable under measurement to determine network compliance or that the attenuation limit for the cable has not been exceeded. However, this conventional method requires complex testing units that are coupled to both ends of the cable under measurement, which impedes cable testing after network installation.

SUMMARY OF THE INVENTION

The present invention is designed to overcome limitations in the prior art by providing a measurement and modeling approach that calculates cable attenuation from a single end location on a cable under measurement. Alternatively, the measurement device is located at a single non-end or intermediate location on a cable, between the network device terminating one end and the node terminating the opposite of the cable. The present invention discloses a system, device and methodology to calculate attenuation in network cables, simultaneously or separately, without the need to access and attach to both ends of the cable under measurement with apparatuses to produce the attenuation measurements. The far end of the cable is electrically open or shorted.

To implement the invention, a measurement device injects and samples responses to time domain reflectometer (TDR) signals. In one aspect of the invention, calibration waveforms, in terms of a voltage drop over a defined time domain, are sampled by a digitizer of the measurement device, recording the response of the signal exposed to known impedances connected to the measurement device. The present invention uses three calibration waveforms, namely $V_T(t)$, $V_S(t)$, and $V_O(t)$, to calibrate a model that estimates internal parameters inherent to a current source responsible for generating the TDR signal in a signal generator. In a second aspect of the invention, the actual cable under measurement is injected with a TDR signal and the response of the cable to the signal and its reflection from the open or shorted far end is sampled by the digitizer and recorded as a cable waveform, $V_C(t)$. $V_C(t)$ represents the voltage drop across the measurement or near end of the cable in response to the propagating TDR signal as a function of time.

Next, a model estimating the current source is calibrated using the calibration waveforms. The calibrated model estimates parameters $A(f)$, $B(f)$, and $D(f)$ that represent the internal parameters of a current source used to generate the TDR signal. Using the modeled parameters of the current source and the cable waveform, impedance of the cable, $Z_C(t)$, is calculated pursuant to the model. From this information, attenuation, $H(f)_{db}$ of the cable under measurement is calculated and displayed as a function of frequency. In some cases, the attenuation of the cable requires further evaluation because of low signal-to-noise effects at high frequencies in long cables. Under such circumstances, the invention employs an additional model that fits the calculated attenuation of the cable at low frequencies to correct for abnormalities resulting in the attenuation data at high frequencies.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1A:
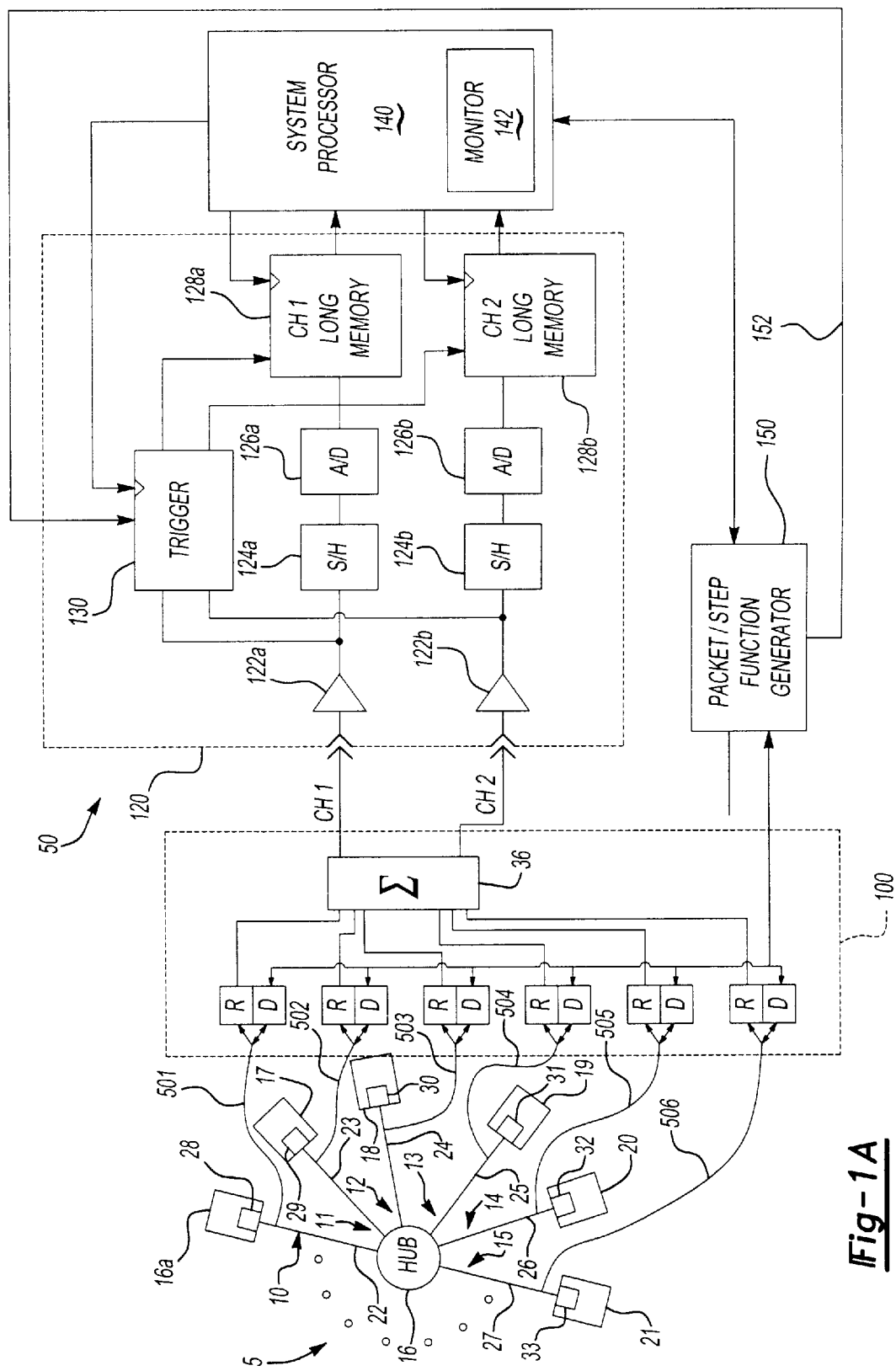
FIG. 1A is a block diagram showing a network diagnostic and measurement device of the present invention.

The present invention provides a diagnostic and measurement device and methodology that utilizes a time domain reflectometer (TDR) pulse or signal to determine an output attenuated by two passes of the pulse through a cable under measurement, a link on a network 5. FIG. 1A illustrates a network diagnostic and measurement device 50 implementing the present invention. Other aspects of the device are described in U.S. patent application Ser. No. 08/619,934, filed on Mar. 18, 1996, entitled Packet Network Monitoring Device, the teachings of which are incorporated herein in their entirety by this reference.

The illustrated network 5 is configured in a star topology, such as in 10Base(T). It incorporates multiple links 10–15. The nodes or computers 16A–21 are located at one end of network cables 22–27 for each of the links. Each of the nodes includes a terminator 28–33 that is matched to the characteristic impedance of the corresponding cables. A hub 16, or alternatively switch or other network communications device, terminates the opposite end of each link 10–15 enabling communications between the nodes by retransmitting packets between the links.

A media interface unit (MIU) 100, or attachment unit, connects a digitizer 120 and signal generation circuits or generator 150 to the physical layer of the network's links 10–15 between terminating hub 16 and nodes 16A–21, which include terminators 28–33. Through the connection to the physical layers of the network links 10–15, MIU 100 permits the monitoring and testing of all links 10–15 independently or simultaneously to perform the testing and measuring activities as described herein. A measurement device 50 connects to the physical layers of links 10–15 at a single location on each link, which includes non-end location on each link cable, or alternatively, at a single end of each link or cable.

The MIU 100 includes the receiver units R that collectively provide a two-channel input to the digitizer 120 through a multiplexer 36. For adequate analog resolution, the digitizer should have at least a 500 MHz sampling frequency with eight bits of resolution per sample.

Figure 1B:
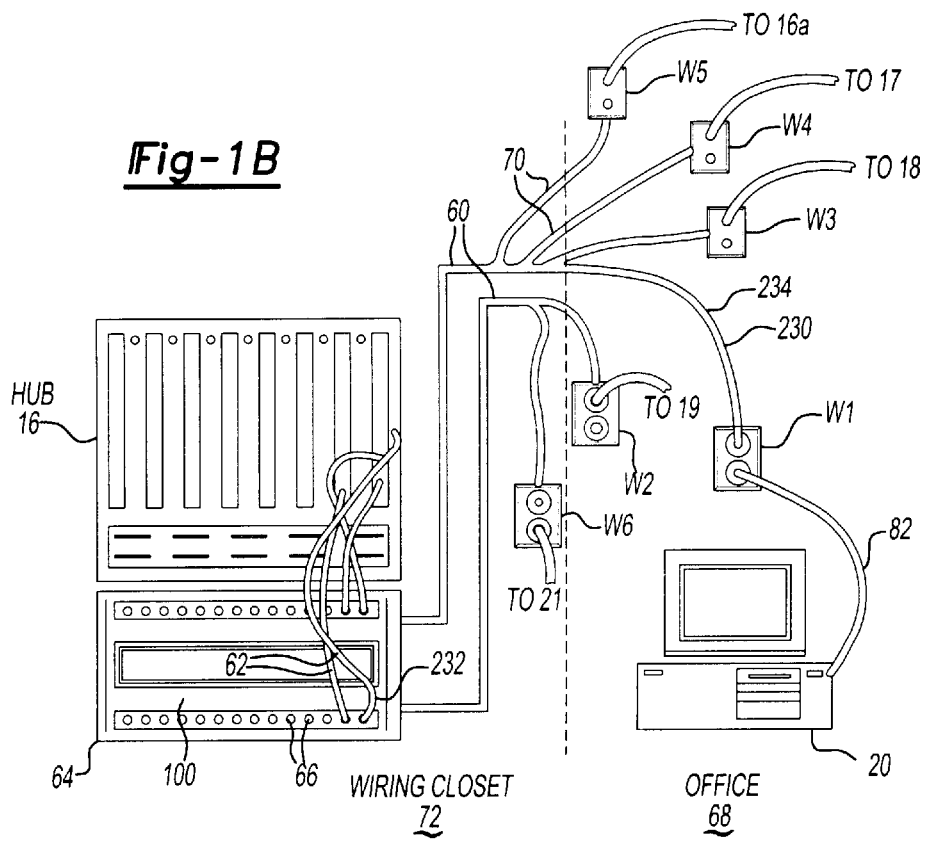
FIG. 1B is a schematic diagram showing the cross-connect panel supporting physical layer access to the cables by the measurement device according to the present invention.

FIG. 1B shows one implementation of the MIU 100 integrated into a cross connect panel 64. Each remote network node 16A–21 is connected to a wall panel W1–W6, commonly located in an office 68 in which the computer 20 is located. These wall panels receive, in one implementation, four twisted pair wires supporting a communications link in a common jack or connector scheme. The wires 70 (representing links 10–15 shown in FIG. 1A) from the wall panels W1–W6 are bundled into larger horizontal cables 60 of 24 to 48 separate groups of four twisted-pair wires from other nodes in other offices.

Each of the horizontal cables 60 usually terminates in a wiring closet 72 housing cross-connect panel 64 and network communications device or hub 16. Each group of wires of a communications link is associated with and electrically connected to a separate port 66 on cross-connect panel 64 and integrated MIU 100. Short jumper cables or patch cords 62 are used between each port 66 of cross-connect panel 64 with integrated MIU 100 and network device 16. Each port 66 has 2 connectors, one connected to the links comprising horizontal cable 60 and the other to patch cord 62. These connectors are electrically connected. These electrical connections are also connected to the MIU through electrical connections 501–505 illustrated in FIG. 1A. These connections provide MIU 100 with access to the physical layer of the network.

Generally, cross-connect panels 64 provide a convenient way to terminate the horizontal cables 60, while allowing computers to be connected to different ports of the network communication device 16. Moreover, the communication device 16 may be replaced simply by switching the patch cords 62 from the pre-existing device to a new device. Ports 66 provide physical layer access to the links by supporting direct signal taps to the communications media of each link. Ports 66 are adapted to receive RJ-45 connectors, in one implementation, which are common in 10Base(T) networks. Patch panel 64, supporting the connection to the network link's physical layer, is located at a non-end point on the links. A patch cable 62 connects panel 64 to hub or other communication device 16 to form a first portion or hub side portion 232 of cable 230. The other end of cable 230 forms a second portion or cable side portion 234 and extends from a port 66 in the panel 64 through the horizontal cable 60 to a wall box W1 at an office. A second patch cable 82 typically connects the computer or network device 20 to wall box W1.

Returning to FIG. 1A, the digitizer 120 comprises a buffering amplifier 122a, 122b on each of two channels Ch1, Ch2, respectively. Two sample-and-hold circuits 124a, 124b downstream of each amplifier freeze the detected voltage in each channel for digitization by two analog-to-digital converters 126a, 126b. The digital outputs of the converters are written into two long memories 128a, 128b, one assigned to each channel Ch1, Ch2. The memories 128a, 128b function as first-in, first-out (FIFO) buffers that continuously receive and store the output from the converters 126a, 126b until a trigger signal is received.

A system processor 140 is connected to read the arrays of data from the long memories 128a, 128b of the digitizer 120. In one implementation, it is a personal computer/workstation, which is also connected to the network 5 via a conventional network card. The system processor 140, through the implementation of software, performs signal processing on the data arrays. The system processor 140 also provides the overall control of the device 50.

Measurement device 50 also includes a monitoring device 142 equipped with a user interface that can display testing results and cable characteristics textually or graphically.

A step function signal generator 150, also under the control of the system processor 140, is connected to network 5 via drive circuits D. Signal generator 150 produces a signal in order to allow the device 50 to perform physical layer analysis of links 10–15. Measurement device 50 injects the step function signal, effectively a time-domaim reflectomery pulse ("TDR"), and receives the reflection of the signal reflecting from the opposite end of the cable at a non-end location on the cable under measurement. Such a non-end location may reside at any location on links 10–15 between terminators 28–33 that mark one single end of the cable and network device 16, which marks the other single end of the cable. Preferably, the TDR pulse is injected and received on cable 10–15 at a location in close proximity to device 16.

In the present invention, a location near hub 16 provides an easy access point to inject the TDR signal and receive a response. It also simplifies the model employed in the instant invention by placing substantially all of the cable under measurement on one side of the TDR location, thereby minimizing the contribution of the short hub side portion 232 of the cable to the overall attenuation of the link. In a case where the hub side portion of the cable is significant, the attenuation of the hub side portion can be separately calculated through the teachings of the present invention and added to the attenuation of the other side of the cable (i.e., the second portion of the cable) to get the attenuation of the entire link. Other aspects involving TDR signals used to measure and diagnose cable characteristics in response to the signals are set forth in U.S. application Ser. No. 08/890,486, filed Jul. 9, 1997, now issued U.S. Pat. No. 6,016,464, U.S. Provisional Application Nos. 60/021,487, filed Jul. 10, 1996, and 60/029,046, filed Oct. 29, 1996, and U.S. application Ser. No. 09/474,390, filed on Dec. 29, 1999 which are incorporated herein in their entirety by this reference.

To determine attenuation in links 10–15, measurement device 50 employs a defined process to measure characteristics of each cable 10–15 to implement model 235 (shown in FIG. 3) by using characteristics of each cable in response to a signal to calculate attenuation. For simplicity of description of the attenuation determination process of the instant invention, the cable under measurement shall be referred to as cable 230. Cable 230 is any links 10–15 of network 5 shown in FIG. 1A and one of the links that comprise horizontal cable 60 shown in FIG. 1B.

Figure 2:
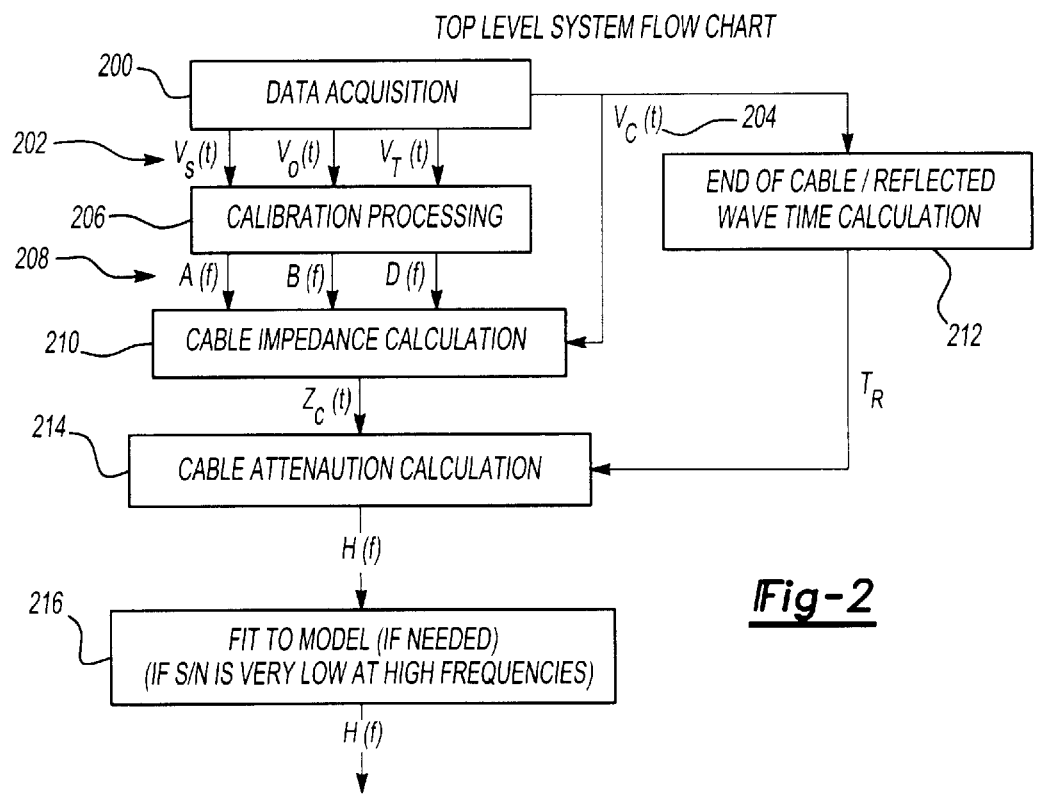
FIG. 2 is a high-level process flow diagram of the attenuation measurement system of the present invention.
Figure 7:
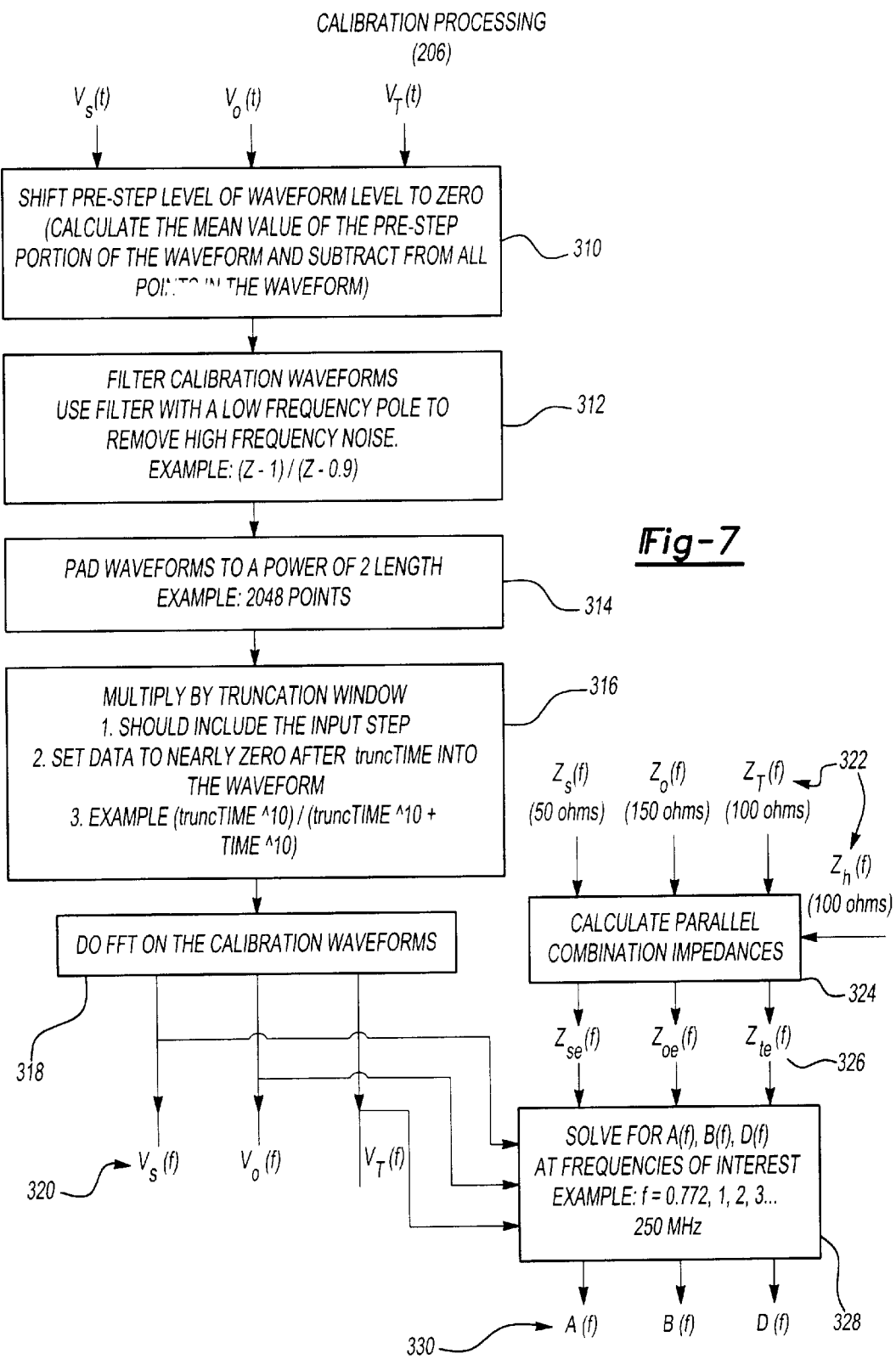
FIG. 7 is a detailed process flow diagram for calibrating the model used to determine attenuation of the cable under measurement.
Figure 12:
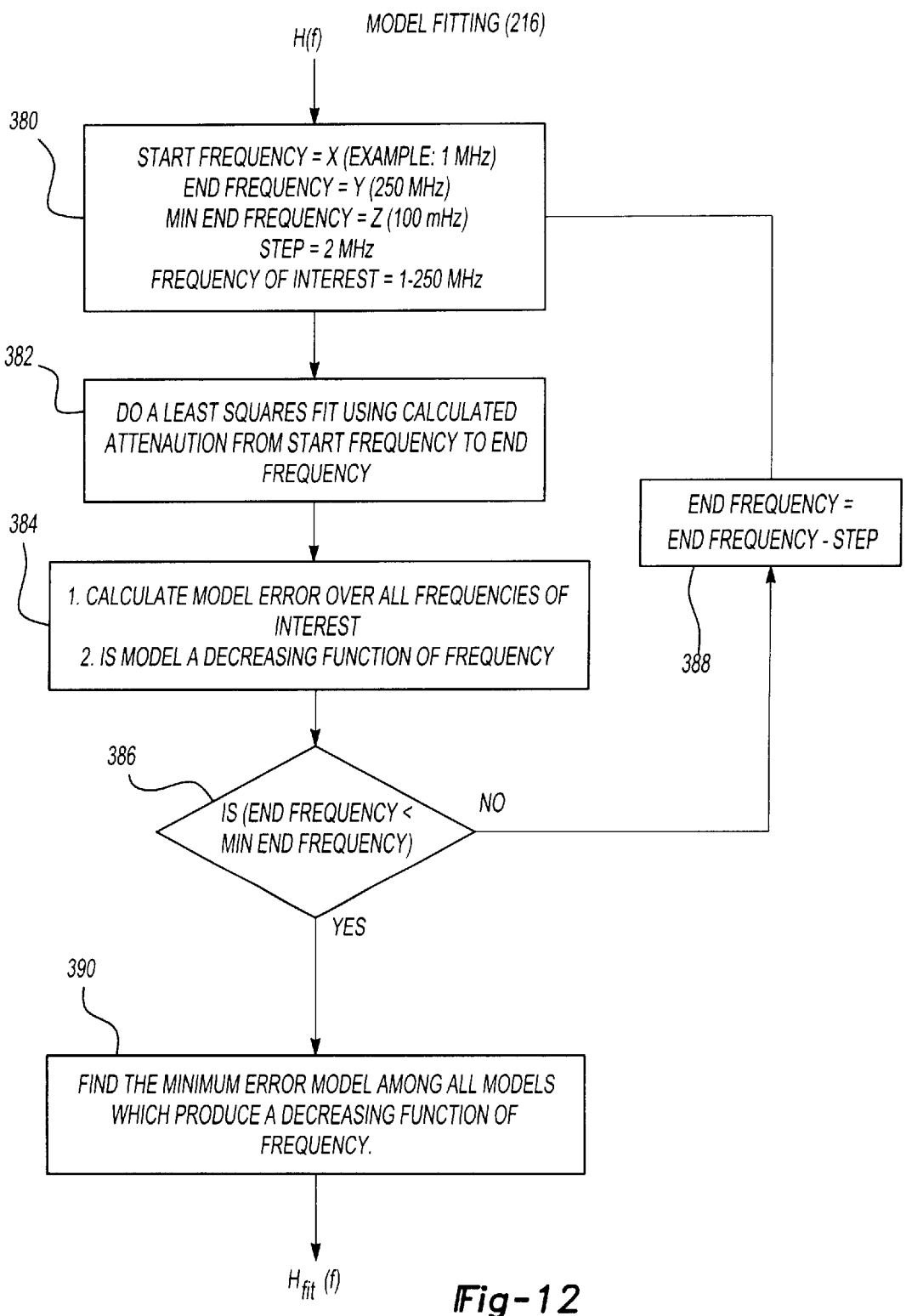
FIG. 12 is a detailed process flow diagram for a model fitting the calculated attenuation of the cable under measurement to correct for errors resulting at high frequencies in long cables.

FIG. 2 discloses a very basic and high level process flow surrounding the methodology used by measurement device 50 to calculate attenuation in links 10–15, simultaneously or separately. First, the methodology employees a data acquisition phase 200, described in detail in FIG. 5. During phase 200, measurement device 50 injects and measures responses to TDR signals to develop calibration waveforms 202 and a waveform 204 of the characteristic response of cable 230. Waveforms 202 and 204 comprise arrays of sampled data measuring the response of the signal in terms of voltage over time. Next, a calibration processing phase 206, described in FIG. 7, is implemented to calibrate model 235 used to determine attenuation of the instant invention. The calibrated model in 206 estimates parameters 208, namely A(f), B(f), and D(f), that represent the internal parameters of a current source used to generate the TDR signal for calibration waveforms 202, $V_T(t)$, $V_S(t)$, and $V_O(t)$, and cable waveform 204, $V_C(t)$. Using parameters 208 and waveform 204, impedance of cable 230 ($Z_C(t)$) is calculated in step 210 as further described in FIG. 9. In step 212, cable waveform 204 is evaluated to determine the time ($T_R$) where the TDR signal injected onto cable 230 encounters the cable's end and reflects back. With this information and the cable impedance $Z_C(t)$, in step 214 and as further described in FIG. 10, attenuation of cable 230 is calculated and displayed through a process that does not require access to and measurements from both ends of cable 230. In some cases, the attenuation of the cable requires further evaluation because of low signal-to-noise ratio or effects (SNR) at high frequencies. Under such circumstances, step 216, further described in FIG. 12, is implemented that fits the calculated attenuation of cable 230 to a model designed to correct for abnormalities in the resulting attenuation data.

Figure 3:
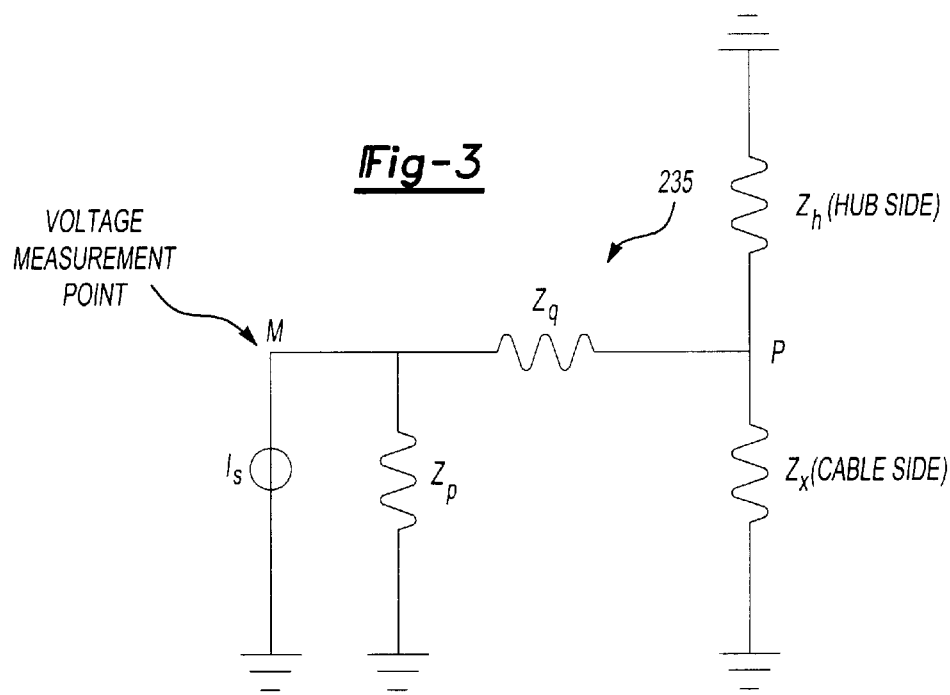
FIG. 3 is a symbolic diagram showing the measurement configuration used to calibrate the measurement device and model.

FIG. 3. symbolically shows measurement model 235 employed by measuring device 50. Measurement device 50 supports a high impedance current source, which is modeled through the relationship of current source ($I_s$) and parallel impedance ($Z_p$) and serial impedance ($Z_q$), respectively, of the current source. Initially in model 235, the values of $I_s$, $Z_p$, and $Z_q$ are unknown. $I_s$, $Z_p$, and $Z_q$ are determined during calibration phase 206 of model 235 discussed herein. To complete model 235, a hub side impedance ($Z_h$) and three cable side impedances ($Z_x$, which can take on three different values) are used. All measurements for model 235 are made at point M, which is a measuring or sampling point internal to device 50.

Figure 4A:
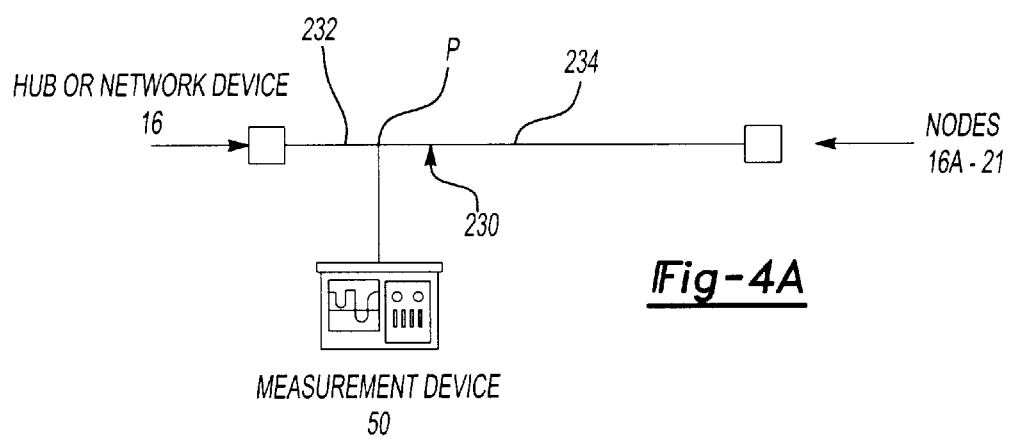
FIG. 4A is a schematic diagram showing the environment in which attenuation of a cable under measurement is computed according to one embodiment of the present invention.

FIG. 4A shows a simplified testing environment for sampling the characteristics of cable 230 and determining attenuation. At P, measurement device 50 is connected to cable 230, which is divided into a first portion or hub side portion 232 and a second portion or cable side portion 234. At one end of hub side portion 232 of the cable connects to measurement device 50 at P and at the other end to network device 16. Likewise, at one end, cable side portion 234 of the cable connects to measurement device 50 at P and the other end to a node 16A–21 or other terminating device on the network. Point P represents ports 66 on device 50, previously described, designed to receive the ends of the cable via standard industry cable connectors.

Figure 4B:
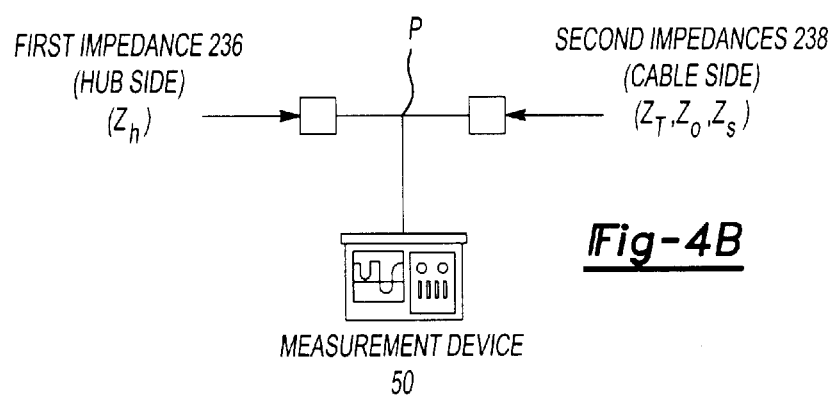
FIG. 4B is a schematic diagram showing the calibration environment used to calibrate the model used to compute attenuation of a cable under measurement according to one embodiment of the present invention.

FIG. 4B shows a calibration environment of the current invention used to calibrate measurement device 50 and model 235. To acquire data on characteristics of the current source used to inject the TDR signal, measurement device 50 is removed from direct connection to cable 230. To calibrate model 235, measurement device 50 connection to the hub side portion 232 and cable side portion 234 are isolated at P and replaced with known impedances. Generally, the connection of the impedances to device 50 is affected by plugging the impedances (i.e. RJ-45 connectors or other connector means known in the art) in port 66, provided in measuring device 50 in place of hub side portion 232 and cable side portion 234 of cable 230. In data acquisition phase 200, to implement model 235, hub side portion 232 connecting device 50 and hub or network device 16 is replaced with a first known impedance ($Z_h$) 236. $Z_h$ impedance is chosen to approximate the characteristic impedance of cable 230, a known value. The characteristic impedance of cable 230 varies dependent on the cable design. For example, it is well known in the art that a standard twisted-pair cable has characteristic impedance of 100 ohms. Likewise, the characteristic of impedance of coaxial cable is 50 or 75 ohms. Typically, the characteristic impedance of manufactured cable is available in the cable's specification as complied by the manufacturer. In a similar manner, cable side portion 234 of cable 230 is also replaced with second known impedances 238.

Figure 5:
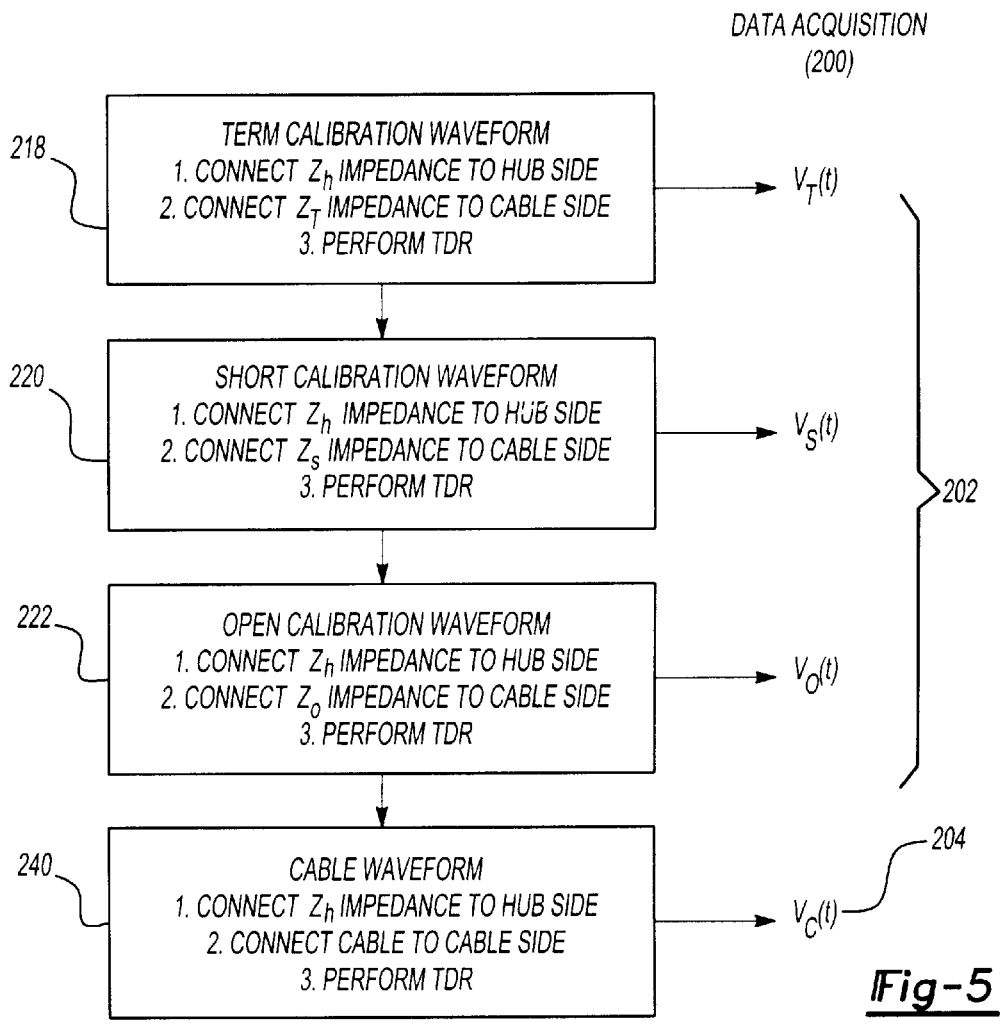
FIG. 5 is a detailed process flow diagram for data acquisition of waveforms in response to an injected signal use to calibrate the model and determine attenuation of the cable under measurement.

FIG. 5 shows a detailed process flow for data acquisition of waveforms 202, 204 in response to an injected signal used to calibrate the model and determine attenuation of cable 230. During data acquisition 200, cable 230 is divided into two portions, a hub side portion 232 and a cable side portion 234. In steps 218, 220, and 222, various impedances 236, 238 are connected in place of hub side portion 232 and cable side portion 234 of cable 230. In each step as also noted above, generator 150 generates a TDR signal pulse across impedances 236, 238, which is sampled by digitizer 120 to determine characteristics of the signal as it is exposed to known impedances provided by impendances 236, 238. More specifically, waveforms 202, sampled in terms of voltage as a function of time, are measured by the digitizer as the signal is exposed to the impedances. These waveforms are $V_T(t)$, $V_S(t)$, $V_O(t)$, and $V_C(t)$. Thereupon, model 235 is calibrated through a defined calibration phase 206 utilizing the calibration waveforms 202.

Generally, waveforms 202 are measured by applying three known calibration impedances, term impedance, $Z_T$, open impedance $Z_O$, and short impedance $Z_S$, to the model at P. The values of the calibration impedances, $Z_T$, $Z_O$, and $Z_S$ are known values over the desired frequency range over which attenuation of cable 230 is measured.

TABLE 1 shows the values used for calibration:

| Measurement Name | Impedance (236) | Impedances (238) | Measured value at M |
|---|---|---|---|
| Short calibration | $Z_T$ | $Z_S$ | $V_S(t)$ |
| Open calibration | $Z_T$ | $Z_O$ | $V_O(t)$ |
| Term calibration | $Z_T$ | $Z_T$ | $V_T(t)$ |

As before, the term or termination impedance, $Z_T$, approximates the characteristic impedance of cable 230. Open impedance provides a known impedance greater than term impedance, $Z_T$. Short impedance provides a known impedance less than term impedance, $Z_T$. For example, when modeling attenuation of twisted pair cable, the term impedance, $Z_T$, is provided with an impedance of 100 ohms, the characteristic impedance of twisted pair cable, open impedance, $Z_O$, with an impedance of 150 ohms, and short impedance, $Z_S$, with an impedance of 50 ohms. Although the calibration impedances may be assigned any known impedance values, preferably the open impedance should be assigned an impedance value significantly greater than termination impedance and the short impedance a value significantly less than the termination impedance.

To determine the term calibration waveform in step 218 of FIG. 5, hub side impedance ($Z_H$) is set to term impedance ($Z_T$) and connected to measuring device 50 as first impedance 236 at P. Likewise, at P, term impedance ($Z_T$) is connected to represent the cable side impedance as second impedance 238. Upon these connections, generator 150 injects a current source of unknown magnitude and inherent impedance as a single step function at P. At M, digitizer 120 detects the response to the signal on cable side portion 234 and samples the waveform generated in response to the signal as an array of data that measures voltage at defined time intervals. The system processor then records the resulting term voltage, $V_T(t)$, as a function of time for a set capture period.

Similarly, to determine short calibration waveform, $V_S(t)$, in step 220, hub side impedance ($Z_H$) is again set to term impedance ($Z_T$) and connected to measuring device 50 as first impedance 236 at P. Likewise, at P, short impedance ($Z_S$) is connected as second impedance 238 to represent cable side impedance. Upon these connections, generator 150 injects a current source of unknown magnitude and inherent impedance as single step function signal at P. At M, digitizer 120 samples the waveform generated by the step function and records the resulting short voltage, $V_S(t)$, as a function of time for a set capture period. In the same manner in step 220, the open calibration waveform is also determined by setting hub side impedance ($Z_H$) to term impedance ($Z_T$) and cable side impedance to open impedance ($Z_O$) at P. Upon injection of the signal, open voltage $V_O(t)$ is sampled and measured as a function of time.

Figure 6:
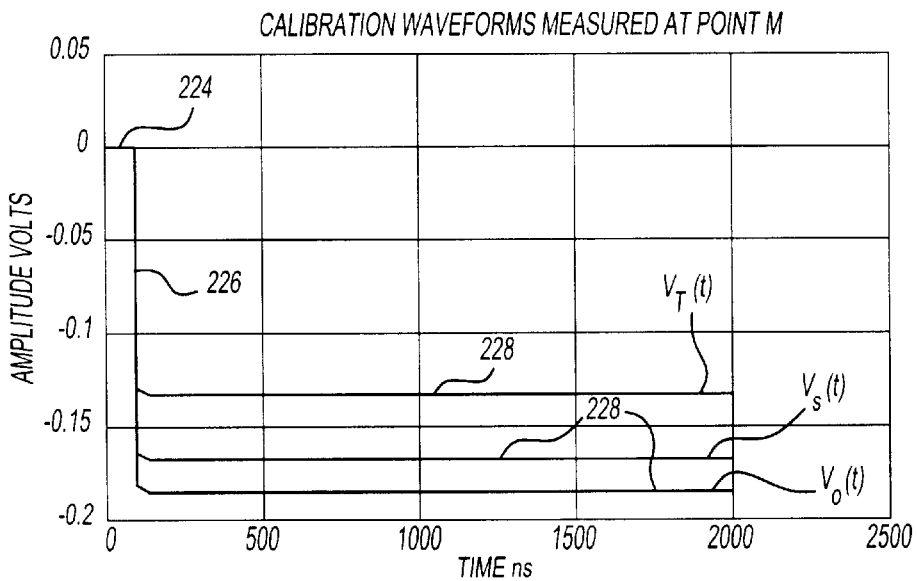
FIG. 6 is an exemplary voltage vs. time plot of waveforms measured in response to an injected signal used to calibrate the model.

FIG. 6. shows an exemplary signal response of the term, short and open calibration waveforms 202 measured at P in terms of voltage as function of time. In each case, because cable 230 has been replaced with known impedances 238, the injected signal never encounters a cable end so no reflected portion of the signal results. In each case, each calibration waveform 202 forms a predictable constant pre-step level 224 prior to injection of the signal with a voltage value of approximately zero, a dramatic step region 226 upon injection of the signal, and a steady-state region 228 following injection where an approximately constant voltage is recorded in response to the known impedance.

FIG. 7 is a process diagram showing calibration processing 206 typically performed to calibrate the model. Upon determining term, short, and open calibration waveforms 202, the waveforms are processed by processor 140 to convert the voltages from the time to frequency domains using Fast Fourier Transfer (FFT) algorithms commonly known in the art. In step 310, the pre-step of each waveform is shifted to zero to correct for any non-zero bias in the current flow prior to the injection of the step function signal. To accomplish the shift, the processor searches the waveform data to isolate the data associated with pre-step 224 for each waveform and calculates a mean value of the data. The mean value is subtracted from all data comprising the waveform and stored. The process is repeated independently for each waveform 202.

Next a filter is applied to all waveform data to convert the step function response into a waveform that will not have a discontinuity when repeated at the stitching point. In step 312, the conversion is accomplished by applying a filter with a zero at zero frequency to eliminate the DC (or direct current) content with a low frequency pole to create a droop in the step waveform. For example, the filter described by the equation (Z—1)/(Z—0.9) can be used.

Each waveform is also modified for FFT application. In step 314, each waveform 202 is padded with zero or another constant value to set each waveform with an array of data equal to a power of two ($2^N$). For example, in the sampling performed on a LAN network, 2000 data points (representing 2000 discrete time intervals) are sampled and padded at the end of the array with 48 zero (0) values to create a data array representing each waveform with 2048 ($2^{11}$) data points. To reduce noise, the part of the waveform at a distance from the step is set approximately to zero in step 316. The process can be accomplished through the multiplication of a truncation window with each waveform. Each of the waveforms 202 is searched to find the data point corresponding to the time (in terms of data samples) of the injection of the step function (truncTime). The truncation window based on the truncTime value is created and applied to the data array of each waveform to mathematically set all data at a distance from truncTime to approximately zero. For example, the conversion can be accomplished through by multiplying EQ. 1 to all data points of the waveform, where "n" represents the index representing each time point in the sample:

$$\text{Window}(n) = (\text{trunctTime}^{10})/(\text{trunctTime}^{10} + \text{Window}(n)^{10}) \quad \text{(EQ. 1)}$$

Upon modification to each waveform 202 data arrays, FFT algorithms commonly known in the art are employed in step 318 to convert the waveforms to the frequency domain providing the voltages $V_S(f)$, $V_O(f)$, and $V_T(f)$ as functions of frequency in step 320.

Similarly, the calibration impedances and the hub impedance are provided in the frequency domain as $Z_S(f)$, $Z_O(f)$, $Z_T(f)$, and $Z_h(f)$, respectively, in step 322. In step 324, combining in parallel the hub impedance ($Z_h$) separately with each calibration impedance results in the combination impedances 326:

$$\begin{cases} Z_{Se} = Z_h \| Z_S \\ Z_{Oe} = Z_h \| Z_O \\ Z_{Te} = Z_h \| Z_T \end{cases} \quad \text{(EQ. 2)}$$

To complete the calibration process, model 235 solves for $V_X$, the voltage at the locale where current source ($I_S$), parallel impedance ($Z_P$) and serial impedance meet at M. $V_X$ is expressed through the relationship of current source to the various model impedances $Z_q$, $Z_{XEQ}$, and $Z_P$ as shown in EQ. 3:

$$V_X = I_S \frac{(Z_q + Z_{XEQ})Z_P}{Z_P + Z_q + Z_{XEQ}} \quad \text{(EQ. 3)}$$

$Z_{XEQ}$ is the parallel combination of hub side impedance ($Z_h$) and cable side impedance ($Z_X$), namely, $Z_{XEQ}=(Z_X\|Z_h)$. Likewise, $Z_{XEQ}$ is expressed as a relationship of current source, impedance $Z_q$ and $Z_P$ and $V_X$ as shown in EQ. 4:

$$Z_{XEQ} = \frac{I_S Z_P Z_q - V_X(Z_P + Z_q)}{V_X - I_S Z_P} \quad \text{(EQ. 4)}$$

To facilitate the calculation of $V_X$ and $Z_{XEQ}$, common terms are collected and defined to simplify the calculation as shown in EQ. 5:

$A = I_S Z_P$ $B = Z_P + Z_q$ $C = Z_q$ $D = AC$ \quad (EQ. 5)

Substituting EQ. 5 into EQ. 4 yields:

$$Z_{XEQ} = \frac{D - V_X B}{V_X - A} \quad \text{(EQ. 6)}$$

As a linear equation, EQ. 6 is expressed in the following form:

$$A Z_{XEQ} - B V_X + D = V_X Z_{XEQ} \quad \text{(EQ. 7)}$$

The parameters A, B and D of EQ. 5 represent the internal parameters of the current source and can be estimated by the solution of a simultaneous system of three equations expressed in EQ. 8:

$$\begin{cases} A Z_{Se} - B V_S + D = V_S Z_{Se} \\ A Z_{Oe} - B V_O + D = V_O Z_{Oe} \\ A Z_{Te} - B V_T + D = V_T Z_{Te} \end{cases} \quad \text{(EQ. 8)}$$

Simplifying the system of equations of EQ. 8 yields a matrix that can be repeatedly solved by processor 140 for the internal parameters of the current source for each frequency point in the desired frequency range in step 328:

$$\begin{bmatrix} A \\ B \\ D \end{bmatrix} = \begin{bmatrix} Z_{Se} & -V_S & 1 \\ Z_{Oe} & -V_O & 1 \\ Z_{Te} & -V_T & 1 \end{bmatrix}^{-1} \begin{bmatrix} V_S Z_{Se} \\ V_O Z_{Oe} \\ V_T Z_{Te} \end{bmatrix} \quad \text{(EQ. 9)}$$

The results 330 of EQ. 9 provide for internal parameter of the current source, A(f), B(f), and D(f), represented in the frequency domain.

Figure 4C:
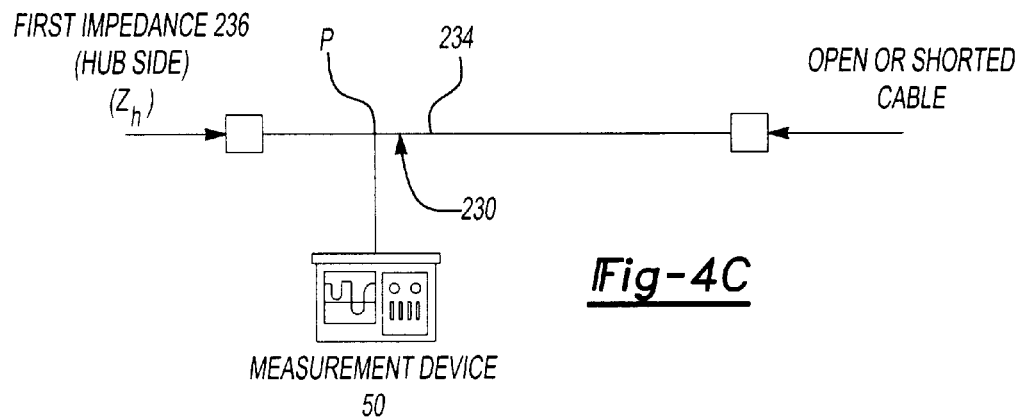
FIG. 4C is a schematic diagram showing the environment for sampling the cable under measurement in response to a signal according to one embodiment of the present invention.

FIG. 4C shows the testing configuration to sample the response of cable side portion 234 of the actual cable to the signal to develop cable waveform 204. Following the calibration of measurement device 50 and model 235, impedances 238 are removed and cable side portion 234 of cable 230 in an open or shorted state is reconnected to measurement device 50 at P. Impedance ($Z_h$) 236 remains connected to measurement device 50 in place of hub side portion 232 of cable 230. As shown in FIG. 5 at step 240, cable waveform $V_C(t)$ 204 is sampled using the same data acquisition methodology previously employed to sample calibration waveforms 202. A signal with unknown parameters is generated by generator 150 and injected onto portion 234 of cable 230 using TDR techniques known in the art. At point M in FIG. 3, the system processor 140 processes data from the digitizer 120 taking measurements of the signal as it propagates along portion 234. The digitizer creates a sample data array for waveform 204 at discrete time intervals. The data sample comprising waveform 204 comprises a series of discrete data points measuring voltage $V_C$ as a function of time over a predetermined time interval sufficient to permit the signal to propagate the entire length of portion 234 (representing cable 230) and back to capture the entire influence on the cable of the signal. Although any number of data points in a sample can be collected for twisted pair cable used in a LAN application, it has been found that sampling at the rate of one gigahertz (one measurement ever one nanosecond) provides for 2000 data points over the estimated maximum length of a LAN cable (LAN cables are typically 100 meters or less). One of ordinary skill in the art would appreciate that a different sample size and rate could be employed using TDR techniques for different cable types and length to provide a sufficient sample to construction an image and data array for waveform 204.

Figure 4D:
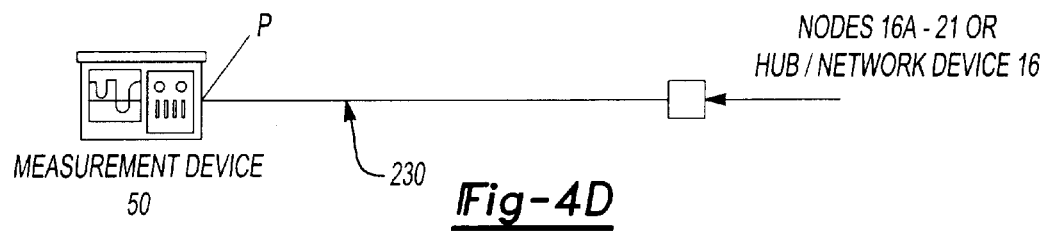
FIG. 4D is a schematic diagram showing the environment in which attenuation of a cable under measurement is computed according to an alternative embodiment of the present invention.
Figure 4E:
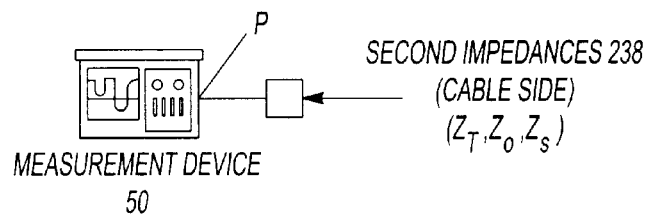
FIG. 4E is a schematic diagram showing the calibration environment used to calibrate the model used to compute attenuation of a cable under measurement according to an alternative embodiment of the present invention.
Figure 4F:
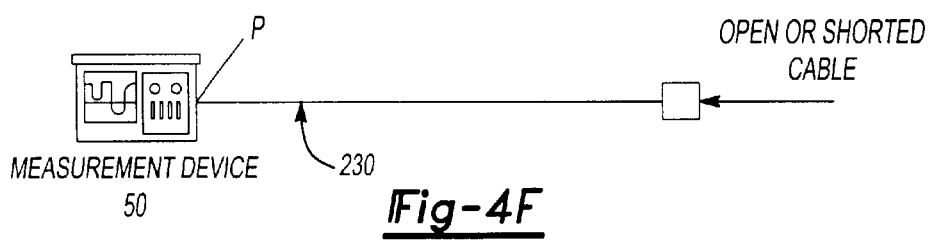
FIG. 4F is a schematic diagram showing the environment for sampling the cable under measurement in response to a signal according to an alternative embodiment of the present invention.

In an alternative embodiment of the invention, measurement device 50 connects to a single end of cable 230 in place of either network device 16 or nodes 16–12. The testing environment for the alternative embodiment is shown in FIG. 4D. In such an environment, no hub side of cable 230 or model 235 exists, thereby simplifying the model. Instead, cable 230 connects directly to measurement device 50 at P. Thereafter, the same data acquisition processes 200 previously described above in FIG. 5 are preformed, except that the steps involving replacement of the hub side portion 232 with impedance 236 to isolate the hub side portion with a known impedance is eliminated in steps 218, 220, 222 and 240. FIG. 4E illustrates the calibration configuration to sample waveforms 202 when measurement 50 resides on a single end of cable 230. Measurement device 50 resides at a single end of cable 230 in place of the network device or the nodes that would otherwise normally be connected at the cable's end in an operating network. In place of cable 230, impedances 238 are connected to measurement device 50. Steps 218, 220, and 222 of data acquisition phase 200, described in FIG. 5 are thereafter performed, except for the step of connecting resistors 236, impedance $Z_h$ is eliminate, and the resulting waveforms 202 sampled. In the same manner, data acquisition step 240 is performed, except that the process of connecting impedance $Z_h$ 236 is eliminated and the remaining aspects of the data acquisition process continue in the testing environment shown in FIG. 4F to sample cable waveform 204.

Figure 8:
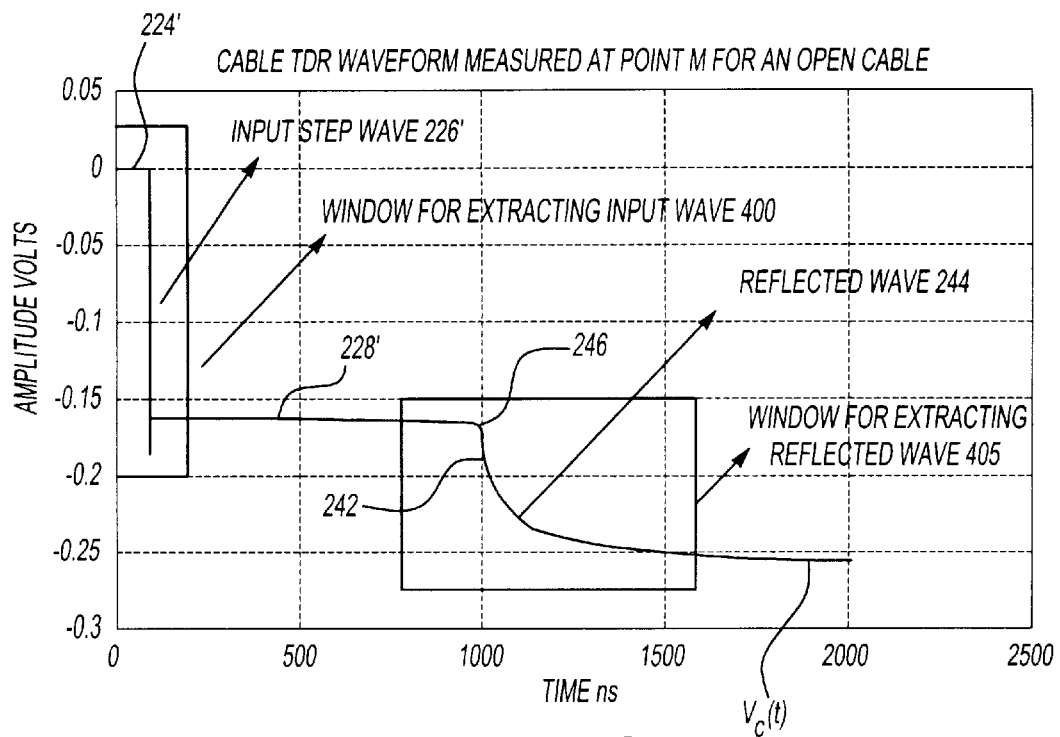
FIG. 8 is an exemplary voltage vs. time plot of a waveform of the cable under measurement's response to an injected signal.

An exemplary response of waveform 204 as measured at point M is shown in FIG. 8. As with the calibration waveforms 202 previously discussed in FIG. 6, waveform 204 comprises constant pre-step level 224' prior to injection of the signal with a voltage value of approximately zero, a dramatic step region 226' upon injection of the step function, and a cable response portion 228' following injection where the signal propagates the length of portion 234 of cable 230 influenced by the cable's structure and characteristics. Upon reaching the end of cable 230, the pulse is reflected resulting in a voltage drop 242 that leads to reflected wave 244 returning the length of portion 234. Voltage drop 242 is typically marked by a distinguishable change in voltage resulting in sloping effect to waveform 204 as the reflected component of the signal returns the cable's length.

Figure 9:
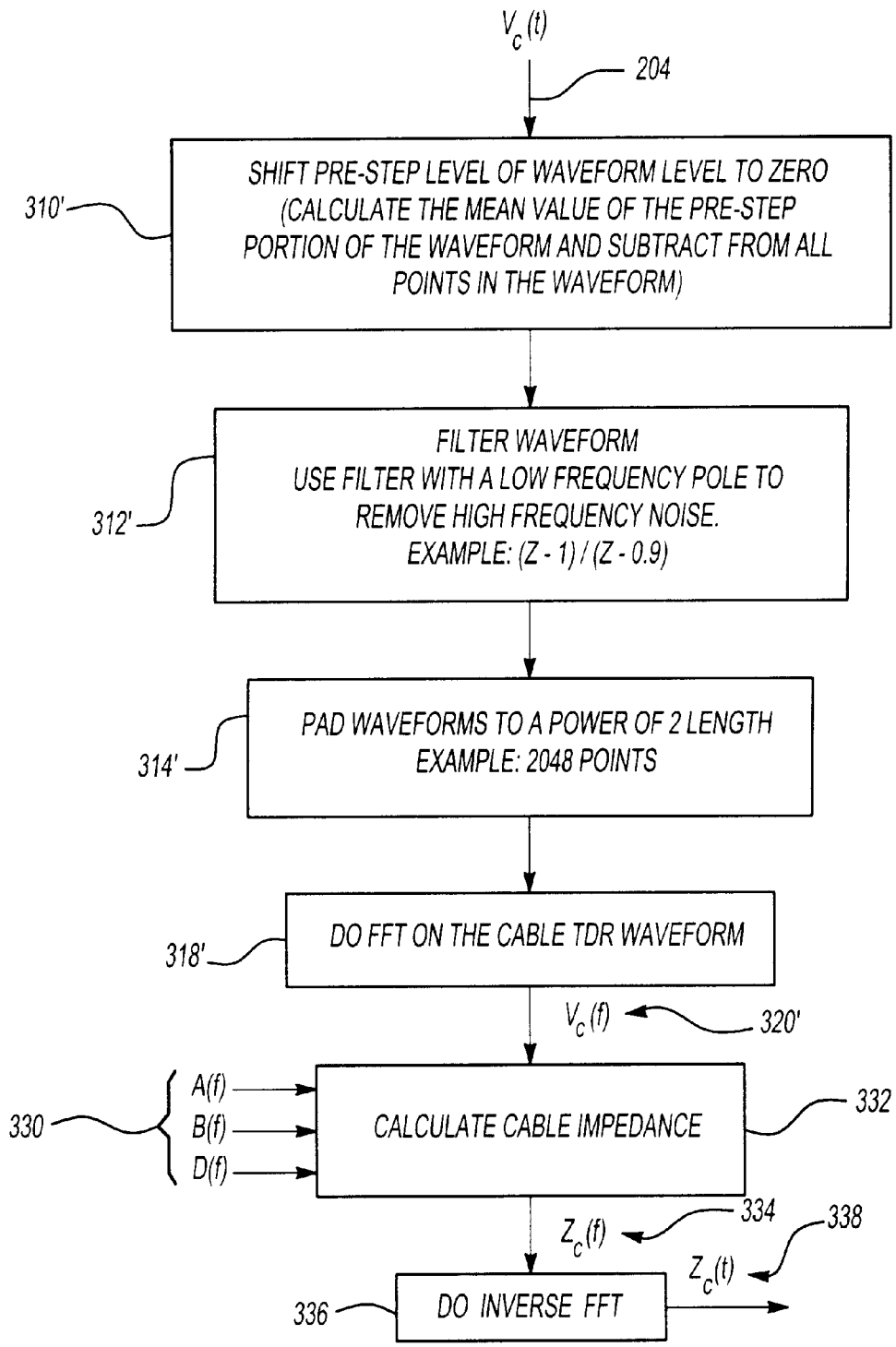
FIG. 9 is a detailed process flow diagram for determining the impedance of the cable under measurement.

Upon sampling waveform 204, the sampled waveform data, $V_C(t)$, is used to calculate the impedance of cable 230 based on the response of cable portion 234. FIG. 9 shows the process flow employed to calculate the impedance of cable 230. The processes used are similar to the data enhancement techniques previously discussed in modifying the samples of calibration impedance waveforms 202 described in FIG. 8, including filtering the sampled data In step 310', the pre-step portion 224' of the waveform is shifted to zero to correct for any non-zero bias in the current flow prior to the injection of the step function. To accomplish the shift, processor 140 searches the waveform data to isolate the data pre-step portion 224' and calculates a mean value of the data in the pre-step portion 224'. The mean value is subtracted from all data comprising waveform 204.

In step 312', the conversion is accomplished by applying a filter with a zero at zero frequency and a low frequency pole in a manner similar to that previously described in relation to the calibration waveforms.

Next, each waveform is modified for FFT application. In step 314', waveform 204 is padded with zero or another constant value to set the number of data points in the array sample equal to a power of two ($2^N$). Upon the modifications to waveform 204, FFT algorithms commonly known in the art are employed in step 318' to convert the waveforms to the frequency domain providing voltage value $V_C(f)$ as a function of frequency in step 320'.

From the calibration process, internal parameters of the waveform, A, B and D 330, and cable voltage $V_C(f)$, all in the frequency domain, are used to calculate cable impedance $Z_C$ in step 332 from EQ. 10:

$$Z_C = \frac{D - V_C B}{V_C - A} \quad \text{(EQ. 10)}$$

The resulting cable impedance of waveform 204 is expressed in the frequency domain as $Z_C(f)$ at step 334. The cable impedance expressed in the frequency domain, $Z_C(f)$, is converted to the time domain in step 336 using inverse FFT algorithms commonly known in the art, resulting in cable impedance $Z_C(t)$ shown at 338.

Figure 10:
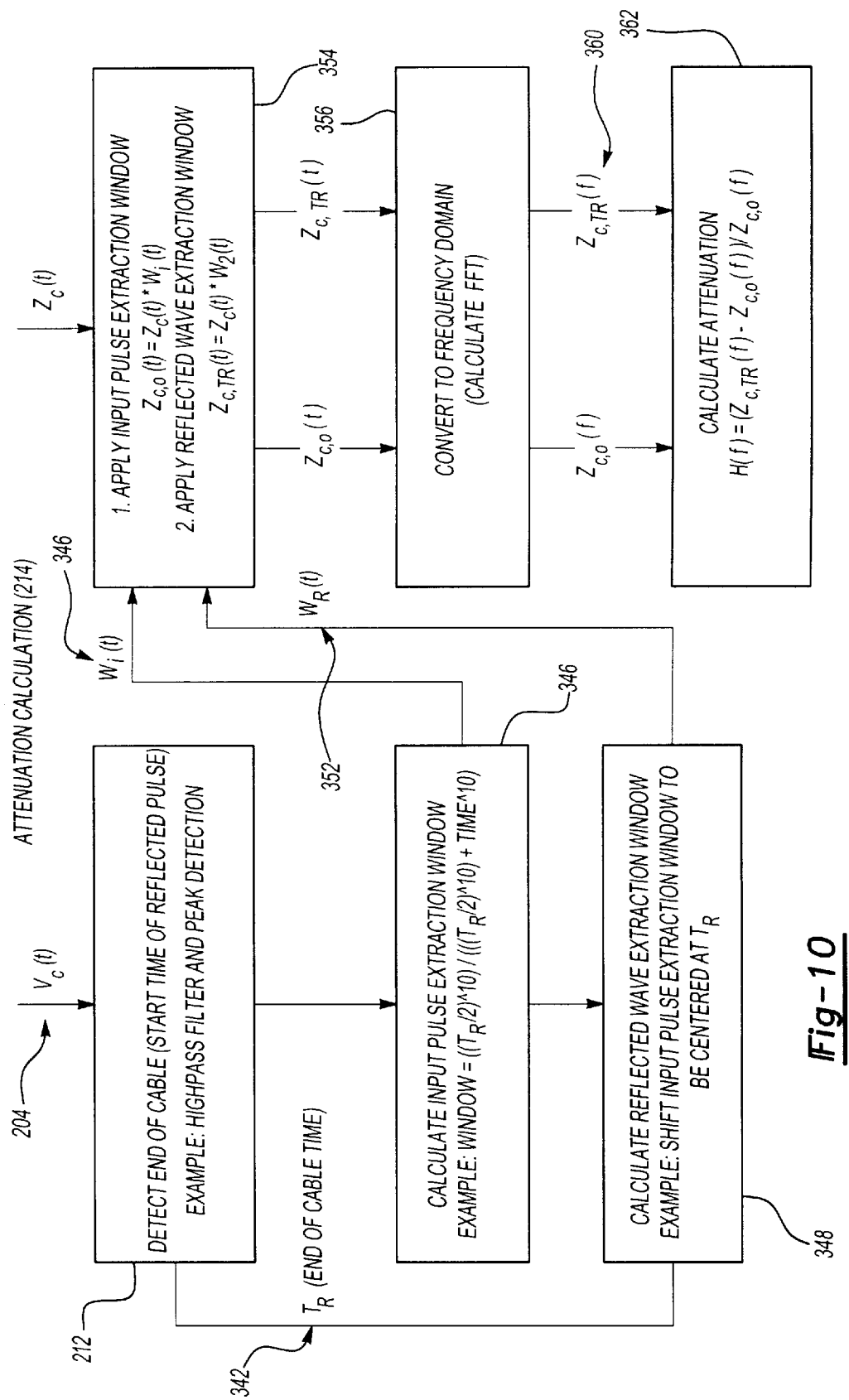
FIG. 10 is a detailed process flow diagram for calculating attenuation of the cable under measurement.

FIG. 10 shows the general process 214 employed to compute the attenuation of cable 230 of the present invention. First, waveform 204 expressed in the time domain, $V_C(t)$, is further analyzed to detect the end of the cable in step 212. A highpass filter and peak detection algorithms commonly employed in the art are implemented by processor 140 to evaluate the sample comprising waveform 204 to locate the time point when the TDR signal encountered the end 246 of the cable and begin the reflected pulse 244. Upon determination, the time point associated with cable's end 246 is stored as $T_R$ as shown in step 342. From $T_R$, an input pulse extraction window 400 can be determined. Input pulse extraction window 400 focuses on the portion of waveform 204 associated with the injection of the step function on the cable as shown in FIG. 8. Window 400 can be calculated through a number of methods known in the art. For example, window 400 can be calculated as a relationship from the cable's end, $T_R$, for all "time" values in waveform 204. EQ. 11 represents the calculation of the window 400 shown in step 144 resulting in $W_I(t)$ as shown in step 346:

$$\text{Window } (W_I(t)) = ((T_R/2)^{10})/((T_R/2)^{10} + t^{10}) \quad \text{(EQ. 11)}$$

Upon calculating input pulse extraction window 400, a reflected wave extraction window 405 is determined at step 348. Reflected wave extraction window focuses on the portion of waveform 204 associated with reflected wave 244 as show in FIG. 8. Although a number of techniques known in the art are available to locate the reflected wave 244 from the data array of waveform 204, window 405 can be effectively calculated by shifting the input pulse extraction window 400 to be centered about the cable's end point time, $T_R$. The resulting window 405 is stored as $W_R(t)$ at step 352.

Figure 13A:
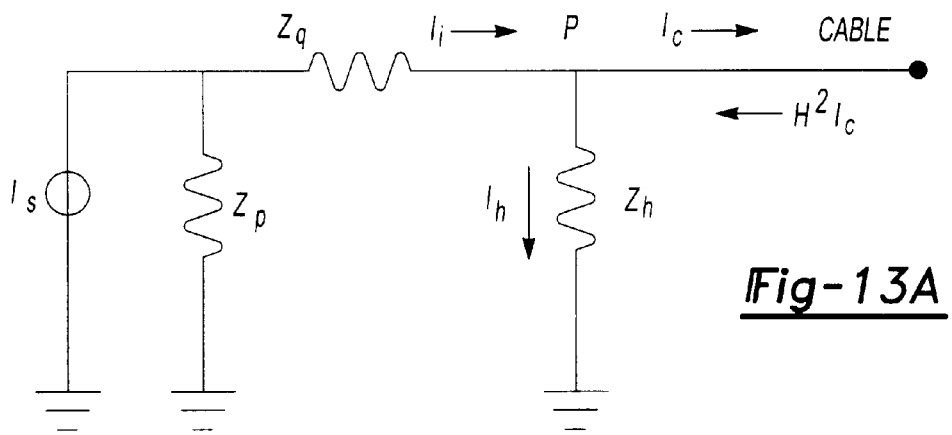
FIG. 13A is a symbolic diagram showing the measurement configuration of the measurement device connected to the cable under measurement.
Figure 13B:
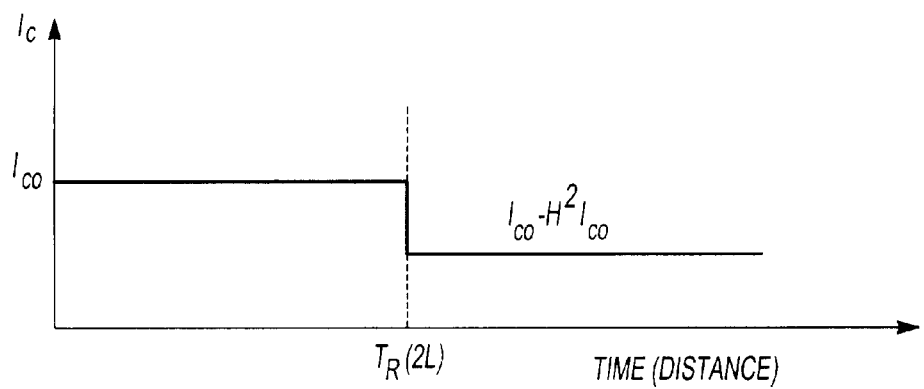
FIG. 13B is an exemplary representation of the current source of the signal in the cable under measurement.
Figure 13C:
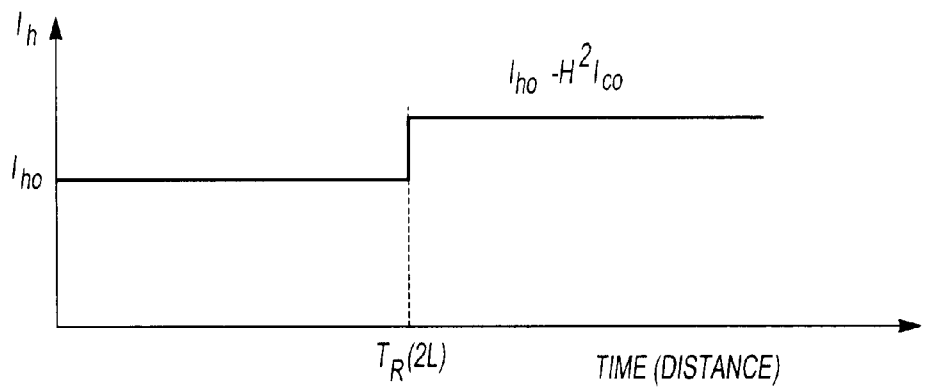
FIG. 13C is an exemplary representation of the current source of the signal in a first impedance, $Z_h$.

To develop the attenuation calculation in step 214, the dynamics of a measurement circuit is analyzed as symbolically represented in FIGS. 13A–13C. For simplicity, all waveforms are assumed to be affected by an attenuation function H(f) as a constant H over all frequencies. Analytically, at any given frequency, assuming a constant current source, the sum of the current flow through cable, $I_C(t)$, and hub calibration impedance, $I_h(t)$, is equal to input current $I_t(t)$. At time zero, it is known that the current flow through the cable experiences the cable characteristic impedance, $Z_O$. This condition is valid until the wave reaches the end of the cable and reflected back to P. The reflected current monitored at P is attenuated by the square of cable attenuation $H^2$. $T_R$ assumes the time taken for the reflected signal to reach the point P. Knowing the current flow through the hub calibration impedance $Z_h$, it is possible, as shown in EQ. 12, to calculate the voltage ratio at point P corresponding to time indexes 0 and $T_R$.

$$V(0) = I_{h0} Z_h$$

$$V(T_R) = (I_{h0} + H^2 I_{C0}) Z_h \qquad \text{(EQ. 12)}$$

From EQ. 12, attenuation can be calculated from the voltage ratio at time index 0 and $T_R$ as shown in EQ. 13 and EQ. 14:

$$\frac{V(T_R)}{V(0)} = \frac{(I_{h0} + H^2 I_{C0}) Z_h}{I_{h0} Z_h} \qquad \text{(EQ. 13)}$$

$$\frac{I_{C0}}{I_{h0}} = \frac{Z_h}{Z_C} \qquad \text{(EQ. 14)}$$

Substituting of EQ. 14 into EQ. 13 yields:

$$\frac{V(T_R)}{V(0)} = 1 + H^2 \left(\frac{Z_h}{Z_C}\right)^2 \qquad \text{(EQ. 15)}$$

Now, assuming that hub impedance ($Z_h$) is approximately equal to characteristic cable impedance ($Z_C$), EQ. 16 results:

$$H^2 = \frac{V(T_R)}{V(0)} - 1 = \frac{V(T_R) - V(0)}{V(0)} \qquad \text{(EQ. 16)}$$

However, voltage at point P remains unknown. Therefore, by dividing EQ. 3 by the input current at P, attenuation can be represented as a function of impedances experienced by the input current at point P. The result yields EQ. 17:

$$H^2 = \frac{Z(T_R) - Z(0)}{Z(0)} \qquad \text{(EQ. 17)}$$

In step 354, the cable's impedance at time zero Z(0) and at time of reflection $Z(T_R)$ can be determined by applying appropriate time domain isolating windows $W_I(t)$ and $W_R(t)$, respectively. The product of $Z_C$ and input pulse extraction window 400 results in cable impedance at time zero, as expressed in EQ 18:

$$Z_{C,0}(t) = Z_C(t) * W_I(t) \qquad \text{(EQ. 18)}$$

Likewise, the product of $Z(T_R)$ and reflected wave extraction window 405 results in cable impedance at the reflected time, as expressed in EQ. 19:

$$Z_{C,TR}(t) = Z_C(t) * W_R(t) \qquad \text{(EQ. 19)}$$

The resulting values of $Z_{C,TR}(t)$ and $Z_{C,0}(t)$ as shown in step 356 are converted from the time domain to the frequency domain through the application of FFT algorithms at step 358. The result generates the cable's impedances $Z_{C,TR}(f)$ and $Z_{C,0}(f)$ as shown in step 360 in the frequency domain. Therefrom, cable attenuation as a function of frequency can be calculated in step 362 by simply translating EQ. 17 to the frequency domain:

$$H(f)^2 = \frac{Z_{C,TR}(f) - Z_{C,0}(f)}{Z_{C,0}(f)} \qquad \text{(EQ. 20)}$$

Because attenuation is commonly represented in decibels, EQ. 20 is convertible to decibels through logarithmic operations resulting in $H(f)_{dB}$ expressed in EQ. 21:

$$H(f)_{dB} = 10 \log_{10} \left( \frac{Z_{C,TR}(f) - Z_{C,0}(f)}{Z_{C,0}(f)} \right) \qquad \text{(EQ. 21)}$$

Figure 11:
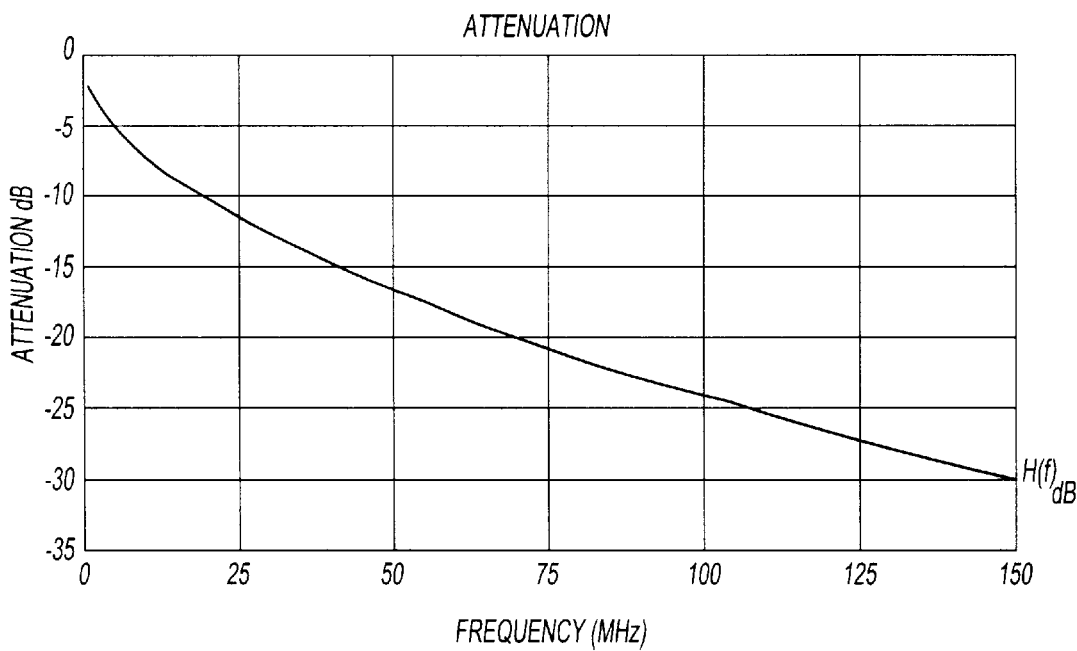
FIG. 11 is an exemplary attenuation vs. frequency plot of the attenuation of the cable under measurement as determined by the present invention.

Using EQ. 21, attenuation of cable 230 can be calculated across the cable's length for all frequencies of interest. The attenuation results, $H(f)_{db}$, are displayable by monitoring device 142 textually as raw data or graphically in chart format as shown in FIG. 11, which plots attenuation as a function of frequency, or downloadable or transferable from measurement device 50 by means known in the art to further analyze or manipulate the attenuation data.

In some cases where the cable's impedance as described by EQ. 17 suffers from low signal to noise ratio (SNR), the results of cable attenuation calculated in 362 may not be accurate. The phenomenon typically occurs at high frequencies in long cables. As a solution, cable attenuation calculated in step 362 is re-estimated and fitted to a model. FIG. 12 shows a general flow process for the model implementing technique that corrects for such errors. As a solution, cable attenuation H(f) is re-estimated by a fitting process that estimate attenuation at high frequencies based on attenuation results recorded at low frequencies. The procedure involves an iterative search for the best portion of the low frequency attenuation data to be used to estimate the model parameters based on least square error criteria. To implement the model, processor 140 identifies the low frequencies in the data array at interest in step 380. Processor 140 evaluates the range of attenuation values between a predefined Start Frequency (i.e. 1 Mhz), End Frequency (i.e. 250 Mhz), min End Frequency (i.e. 100 Mhz) and a Step value (i.e. 2 Mhz). Next, in step 382, the processor performs a least squares fit iterative operation using selected range of attenuation values between the Start Frequency and End Frequency according to the theoretical model expressed in EQ. 22, the terms of which are readily obtainable from the cable manufacturer or known by one of ordinary skill in the art:

$$A(f) = e^{-(a_1 + a_2 f + a_3 \sqrt{f})} \qquad \text{(EQ. 22)}$$

The processor calculates the model error over all frequencies of interest in step 384 and also determines whether the model represents a decreasing function of frequency. If a decreasing function of frequency results, the processor stores the model for further evaluation. In step 386, the processor determines if the End Frequency value is less than the predefined min End Frequency value; if not the iterative process is repeated with the End Frequency value redefined as the End-Frequency minus the predefined Step as defined in step 388. Once the End Frequency value is found to less than min End Frequency value, all models demonstrating a decreasing function of frequency are compared to select the minimum error model which results in re-estimated attenuation value represented as $H_{fit}(f)$ across all frequency domains in step 390. As before, the re-estimated attenuation values can be further evaluated by the system or displayed to analyze the attenuation characteristics of cable 230. The iterative operation described in FIG. 12 serves as an example of one of various different models known in the art to compensate for erroneous cable characteristics caused by low signal-to-noise effects at high frequencies in long cables.

Those skilled in the art should readily appreciate that the device, system and methodology defining the operations and methods defined herein are deliverable to a system in many forms, including but not limited to (a) information permanently stored on non-writeable storage media such as ROM devices, (b) information alterably stored on writeable storage media such as floppy disks, magnetic tapes, CDs, RAM devices, and other magnetic and optical media, or (c) information conveyed to a computer through communication media, for example using baseband signaling or broadband signaling techniques, as in an electronic network such as the Internet or telephone modem lines. The operations and methods may be implemented in software executable out of a memory by the processor or as a set of instructions embedded in a carrier wave. Alternatively, the operations and methods may be embodied in whole or in part using hardware components, such as Application Specific Integrated Circuits (ASICs), state machines, controllers or other hardware components or devices, or a combination of hardware and software components, or hardware, software or firmware simulators.

While this invention has been particularly shown and described with references to preferred embodiments thereof, it will be understood by those skilled in the art that various changes in form and details may be made therein without departing from the spirit and scope of the invention as defined by the appended claims.

What is claimed:

1. A network analysis device for measuring attenuation in a digital network, comprising:
    a digitizer located at a single location on at least one cable that samples at least one characteristic of said cable in response to a signal propagated on said cable and originating from said single location; and
    a processor that computes attenuation of said cable; and a modeling that evaluating said attenuation of said cable for errors, actively or passively, caused by low signal-to-noise effects.

2. A network analysis device of claim 1, wherein said single location is an intermediate point between opposing ends of said cable that divides said cable into a first portion and a second portion.

3. A network analysis device of claim 2, wherein said first portion is isolated and said signal is propagated on said second portion.

4. A network analysis device of claim 1, wherein a said processor computes said attenuation by implementing a model.

5. A network analysis device of claim 4, wherein said model is calibrated by sampling a response to said signal exposed to known impedances.

6. A network analysis device of claim 1, wherein said characteristic is voltage, impedance, or current.

7. A network analysis device of claim 1, wherein said signal is a step function injected by the device at said single location on said cable.

8. A network analysis device of claim 1, wherein said single location is one end of said cable.

9. A method for measuring attenuation in a digital network, comprising:
    sampling at least one characteristic of at least one cable in the network at a single location on said cable in response to a signal originating from said single location on said cable; and
    computing attenuation of said cable based on said characteristic of said cable.

10. A method of claim 9, further comprising implementing a model based on said characteristic of said cable; and a model that evaluates said attenuation of said cable for errors actively or passively caused by low signal-to-noise effects.

11. A method of claim 10, wherein said model is calibrated by sampling a response to said signal to known impedances.

12. A method of claim 9, wherein said single location is an intermediate point between opposing ends of said cable that divides said cable into a first portion and a second portion.

13. A method of claim 12, wherein said first portion is isolated and said signal is propagated on said second portion.

14. A method of claim 9, further comprising injecting a signal on said cable at said single location on said cable.

15. A method of claim 9, wherein said single location is one end of said cable.

16. A system for measuring attenuation in a digital network, comprising:
    a measurement device located at a single location on at least one cable of the network that samples, with a digitizer, at least one characteristic of said cable in response to a signal originating from said single location on said at least one cable; and
    a model implemented by a processor of said measurement device to analyze said model based on said characteristic to determine attenuation of said cable; and
    evaluates said attenuation of said cable for errors actively or passively caused by low signal-to-noise effects.

17. A system of claim 16, wherein said single location is an intermediate point between opposing ends of said cable that divides said cable into a first portion and a second portion.

18. A system of claim 17, wherein said first portion is isolated and said signal is propagated on said second portion.

19. A system of claim 16, wherein said measurement device comprises a signal generator that injects said signal for transmission over said cable at said single location on said cable.

20. A system of claim 16, wherein said single location is one end of said cable.

21. A system of claim 16, wherein said model is calibrated by sampling a response to said signal to known impedances.

22. A system for measuring at least one characteristic of a cable in a digital network comprising:
    a measurement device that connects to the cable divided into a first portion and a second portion;
    a first impedance with a known impedance that replaces said first portion of the cable and connects to said measurement device;
    a signal generator that injects a signal across said second portion of the cable; and a digitizer that samples a response of said second portion of the cable to said signal; and a model implemented by said measurement device that modifies said attenuation based on low signal-to-noise effects of the cable.

23. A system of claim 22, further comprising,
    a second impedance with a known impedance that replaces said second portion of the cable and connects to said measurement device; and wherein said signal generator injects said signal across said second impedance and said digitizer samples a response of said second impedance to said signal.

24. A system of claim 23, further comprising, a model implemented by said measurement device, calibrated by said response of said second impedance to said signal.

25. A system of claim 24, wherein said measurement device determines attenuation in the cable based on said model and said response of said second portion of the cable to said signal.

26. A system of claim 23, wherein said second impedance is a plurality of different impedances.

27. A network analysis device for measuring attenuation in a digital network, comprising:

sampling means for measuring at least one characteristic of at least one cable at a single location on said cable in response to a signal originating from said single location on said cable; and analyzing means for evaluating said characteristic of said cable to determine attenuation of said cable; and modeling means for evaluating said attenuation of said cable for errors, actively or passively, caused by low signal-to-noise effects.

28. A network analysis device of claim 27, wherein said analyzing means comprises modeling means that estimates at least one characteristic of said signal.

29. A network analysis device of claim 28, wherein said modeling means comprises calibrating means for said model using known impedances.

30. A network analysis device of claim 27, further comprising generating means for injecting said signal for transmission over said cable at said single location on said cable.

* * * * *